(12) United States Patent
Bednar et al.

(10) Patent No.: US 6,269,327 B1
(45) Date of Patent: *Jul. 31, 2001

(54) SYSTEM AND METHOD FOR GENERATING WIRE BOND FINGERS

(75) Inventors: Richard G. Bednar, Johnson City; Thomas P. Comino, Vestal, both of NY (US); Donald J. Malling, Brackney, PA (US); David P. Pagnani, Endicott, NY (US)

(73) Assignee: International Business Machines Corporation, Armonk, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/248,342

(22) Filed: Feb. 11, 1999

(51) Int. Cl.[7] .............................. G06G 7/48; H01L 29/40
(52) U.S. Cl. .................................. 703/8; 257/786
(58) Field of Search ................... 703/8; 257/786

(56) References Cited

U.S. PATENT DOCUMENTS

| | | | | |
|---|---|---|---|---|
| 4,924,353 | * | 5/1990 | Patraw | 361/783 |
| 5,061,988 | * | 10/1991 | Rector | 257/689 |
| 5,155,578 | * | 10/1992 | Lim et al. | 257/784 |
| 5,404,047 | * | 4/1995 | Rostoker et al. | 257/876 |
| 5,465,217 | * | 11/1995 | Yip et al. | 395/500.22 |
| 5,498,767 | * | 3/1996 | Huddleston et al. | 395/500.13 |
| 5,677,847 | * | 10/1997 | Walling | 395/500.02 |
| 5,801,450 | | 9/1998 | Barrow | 257/784 |
| 5,818,114 | | 10/1998 | Pendse et al. | 257/786 |
| 5,895,977 | * | 4/1999 | Banerjee | 257/786 |
| 5,951,304 | * | 9/1999 | Wildes et al. | 439/67 |
| 6,008,532 | * | 12/1999 | Carichner | 257/691 |
| 6,037,669 | * | 3/2000 | Shu et al. | 257/786 |

* cited by examiner

Primary Examiner—Kevin J. Teska
Assistant Examiner—Hugh Jones
(74) Attorney, Agent, or Firm—Shelley M Beckstrand

(57) ABSTRACT

Chip carrier topology including a plurality of bond lines radiating from a line of chip pads to at least one of zero or more finger lines and zero or more voltage lines is defined by first collecting topology parameters selected from the set including the number of rows of fingers; the spacing between rows of fingers; finger style, said finger style being one of arc-of-circle, constant-bond-length, and encompassing-rectangle; location of voltage rings; value of voltage rings; location of chip pads; voltage of chip pads; dimensions of output fingers; minimum finger pair spacing; maximum finger angle with respect to its bond line; minimum spacing of bond line terminations at voltage rings; and minimum spacing of bond line terminations with respect to and adjacent bond line which terminates at a finger. A plurality of possible topology solutions are generated, and a single possible topology solution selected for further processing. From the single possible solution, a topology solution is generated by placing a middle finger with respect to a middle chip pad, processing alternative chip pads to the right and left sequentially from the middle chip pad selectively to position ring intercepts, inner row fingers and outer row fingers. The topology solution thus generated is evaluated and if acceptable, the result is output to an output file; if not acceptable for failure to conform to all topology parameters, the topology parameters are adjusted and the topology solution generated anew.

28 Claims, 15 Drawing Sheets

SYSTEM AND METHOD FOR GENERATING WIRE BOND FINGERS

BACKGROUND OF THE INVENTION

1. Technical Field of the Invention

This invention pertains to chip carrier topology design, including wire bond finger placement. More particularly, it relates to a simulation technique for automating wire bond finger placement.

2. Background Art

Pin ball grid array (PBGA) substrates (also referred to as chip carriers) are used in the art for attachment of electronic chips. A chip is attached in the center of the substrate, and physical wiring connections made between the chip and the substrate via discrete wires. Chips have an array of bond pads around the perimeter to which these discrete wires are attached. An analogous bond bad on the substrate is the wire bond finger, referred to as fingers because they are usually long and narrow and fan out like the fingers of an outstretched hand. Thus, wire bond fingers are a series of I/O pads physically resident on a chip carrier and which connect to I/O pads on a chip. When the chip is placed within the cavity of a chip carrier, wires run out radially from the chip and are attached to the wire bond pads.

The creation of the wire bond fingers is usually one of the last steps in the process of attaching a chip to a substrate. This is because (1) a substrate is custom designed for the chip which will attach to it, and design of the substrate must wait until the chip design is complete; and (2) due to the ever increasing wiring density, uniqueness of each design and other factors at all levels of design of electronic components, it isn't feasible to create a standard set of wire bond fingers. The pads have to have a minimum size and spacing in order to accommodate automated wire bonding machines which physically attach wires during the manufacturing process. There is a minimum spacing requirement for the distance from the fingers to the encompassing chip carrier circuitry. Similarly, there is a minimum and maximum wire length for the wire which attaches the chip I/O to the wire bond finger. The fingers also must angle appropriately such that they lay along the axis of a straight line connecting the finger and the chip I/O to which it will connect. If the chip I/O is a voltage net (as distinguished from a signal net), then the wire connection will terminate at a voltage ring. Voltage rings are optional and when present encircle the chip and lie between the chip and the wire bond fingers.

While this recitation of the requirements and constraints for placement of wire bond fingers is illustrative and not exhaustive, it does convey the understanding that numerous criteria go into the placement of wire bond fingers, and that numerous parameters must be met in order for a wire bond finger pattern to qualify as a possible solution. A minor alteration to any one of the many parameters can lead to a different possible solution. Given the number of parameters and possible combinations, there can exist an almost limitless number of possible finger solutions. There is a need in the art to provide to the designer of electronic packages an understanding of possible solutions so that the best solution can be selected. The best solution is one which balances constraints such that all parameters are well within tolerance and the best possible use is made of the available substrate real estate.

As a result, a unique set of wire bond fingers is generated for each substrate/chip package. The wire bond fingers must be small enough to squeeze into the space available but large enough to meet packaging ground rules. The fingers must be placed at the appropriate angle (i.e., fan out or fan in) in order to support the printed wiring which will be attached on the substrate surface. The fingers must be spaced far enough apart to allow the wire bonder head to move past a finger without dislodging a discrete wire from on an adjacent finger. And each finger must meet minimum and maximum spacing guidelines from the chip as well as the surrounding substrate wiring.

Referring to FIG. 5, the constant bond length (CBL) finger style of the prior art is illustrated. FIG. 6 illustrates a zoom-in of the upper left corner of the design. As package circuit density has continued to increase, the CBL finger style has produced finger patterns which are less than optimal, often failing to take advantage of available real estate, especially in the corners.

The current art supports specification of chippad locations by identifying:
1. Location of first chippad.
2. Location of last chippad.
3. Total quantity of chippads per side (i.e., north, south, east, and west).

Using this information, the location of chippads for a single side is generated. Then the data for a single side is stepped and repeated about the origin to generate chippad locations for all four sides. This technique works fine until the following problems arise:
1. The chippad locations for each side become non-symmetrical. No longer can the chippad layout for a single side be stepped and repeated about the origin. Now chippad locations have to be entered individually for each side.
2. The chippad locations are no longer uniformly spaced. As a result, the only way to know the location of the chippads is for the user to specify the exact location of each pad.

Voltage rings are an optional component of a substrate carrier. When present, these rings encircle the chip and are used to wire a chippad to a specific voltage.

The current art for wire bond finger generation does not take voltage ring information into account. Rather, chip I/O pads are incorrectly routed to a wire bond finger. The designer then must manually correct the design data to terminate the bond line at the voltage ring. There are two problems with this approach:
1. This is a manual activity which could be more efficiently and accurately performed by finger generation software.
2. This incorrect wiring contributes to wasted real estate, since the minimum spacings at the voltage rings are generally smaller than the minimum spacing at the fingers.

It is an object of the invention to provide an improved system and method for the placement of fingers on a substrate carrier.

It is a further object of the invention to provide finger layout styles which achieve optimal finger layout, particularly in the corners.

It is a further object of the invention to provide a system and method for accommodating the layout of chippads on non-symmetrical sides.

It is a further object of the invention to provide a system and method for accommodating the layout of chippads which are not uniformly spaced.

It is a further object of the invention to provide a system and method for automatically wiring chip I/O pads to voltage rings.

It is a further object of the invention to increase designer productivity and to use new finger layout patterns which most effectively make use of available real estate for interconnect wiring between chip and chip carrier.

It is a further object of the invention to provide a system and method which advances the state of the art with regard to generation of wire bond finger data for chip carriers by improving designer productivity by automating activities previously done manually; improving manufacturability and reliability of the resultant product through the use of new finger layout styles; and optimize the use of available real estate via implementation of the new finger layout styles and the automatic wiring of chip I/O pads to voltage rings.

SUMMARY OF THE INVENTION

In accordance with the system and method of the invention, chip carrier topology is defined by first collecting topology parameters. A plurality of possible topology solutions are generated, and a single possible topology solution selected for further processing. From the single possible solution, a topology solution is generated by placing a middle finger with respect to a middle chip pad, processing alternative chip pads to the right and left sequentially from the middle chip pad selectively to position ring intercepts, inner row fingers and outer row fingers. The topology solution thus generated is evaluated and if acceptable, the result is output to an output file; if not acceptable for failure to conform to all topology parameters, the topology parameters are adjusted and the topology solution generated anew.

Other features and advantages of this invention will become apparent from the following detailed description of the presently preferred embodiment of the invention, taken in conjunction with the accompanying drawings.

BRIEF DESCRIPTION OF THE DRAWINGS

FIG. 15 is a schematic view illustrating finger spacing for fan-out and fan-in.

BEST MODE FOR CARRYING OUT THE INVENTION

Figure 1:
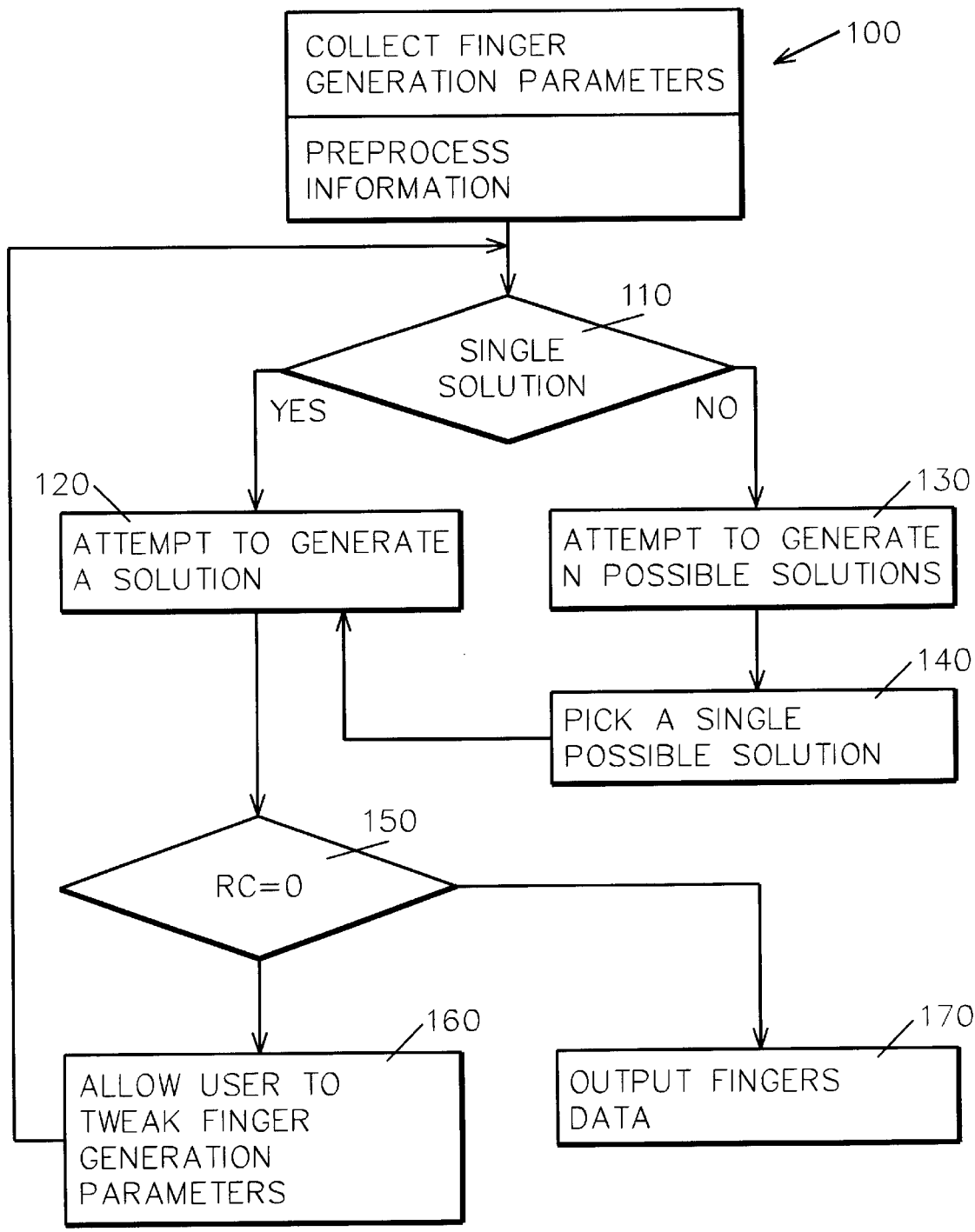
FIG. 1 is a flow diagram illustrating the method steps of the preferred embodiment of the invention.

In accordance with a preferred embodiment of the invention, a wire bond fingers generation application is provided as a C++ program running in the AIX environment with Visualage C++ GUIs. This application allows a design engineer to specify over a dozen different parameters required for data generation. Typically, the application is run iteratively in order to obtain an optimal finger placement pattern which evenly balances spacing tolerances, thus minimizing defects and scrap. Output data is generated in a variety of formats enabling the designer to combine the finger data with a preexisting substrate design. Further in accordance with the invention, finger styles may be specified as constant bond length, arc of circle, and encompassing rectangle, and output may be provided in GL/1, Cadence, or Autocad. The location of chippads may be identified via a netlist dataset or by entering start, stop, and quantity. Further, bondlines may terminate at a finger (for signal lines) or at a ring (for ground or voltage), fingers can be generated on a single row or on two rows, and the user is provided the option to select a best solution from several possible solutions from a simulation based on rough input parameters and then obtain an output of generated data based on the best possible solution.

In accordance with the preferred embodiment of the invention, a new finger approximate location is calculated based upon finger pitch (i.e., spacing) and style with respect to a previously positioned finger. Then, the actual spacing between the resulting finger pair is examined, the requested pitch updated, and another pass made at calculating the new finger location. These repetitive adjustments to the current finger spacing have no impact on the spacing originally specified by the user, but instead serve to compensate for the non-orthogonal and unpredictable placement of adjacent fingers. By repetitively adjusting the finger spacing for this pair of fingers to move them further apart or closer together, the user's specification is eventually achieved. All of this is implemented, in accordance with the preferred embodiment, in a recursive function, a function which calls itself to further refine the location of the finger. In this manner, fingers which were originally too close will move apart, and fingers which are too far apart will move closer to each other. Eventually a threshold is exceeded where fingers which were originally too close are now too far apart. The logic recognizes this event, refines the pitch adjustment to a smaller value, and reverses direction. This process continues until a finger is placed with sufficient degree of accuracy.

Further in accordance with the preferred embodiment of the invention, the concept of simulation is introduced for placement of wire bond fingers. Within this context, simulation is the process of repetitively altering one or more key parameters in small increments in order to determine if a solution is available. During simulation, successful finger solution data is discarded, but the parameters which went into the solution are recorded. After a prescribed number of solutions are identified, the results are presented to the user designer, who can then either pick a best solution and have the application generate finger data, or request that additional simulation be conducted.

Figure 5:
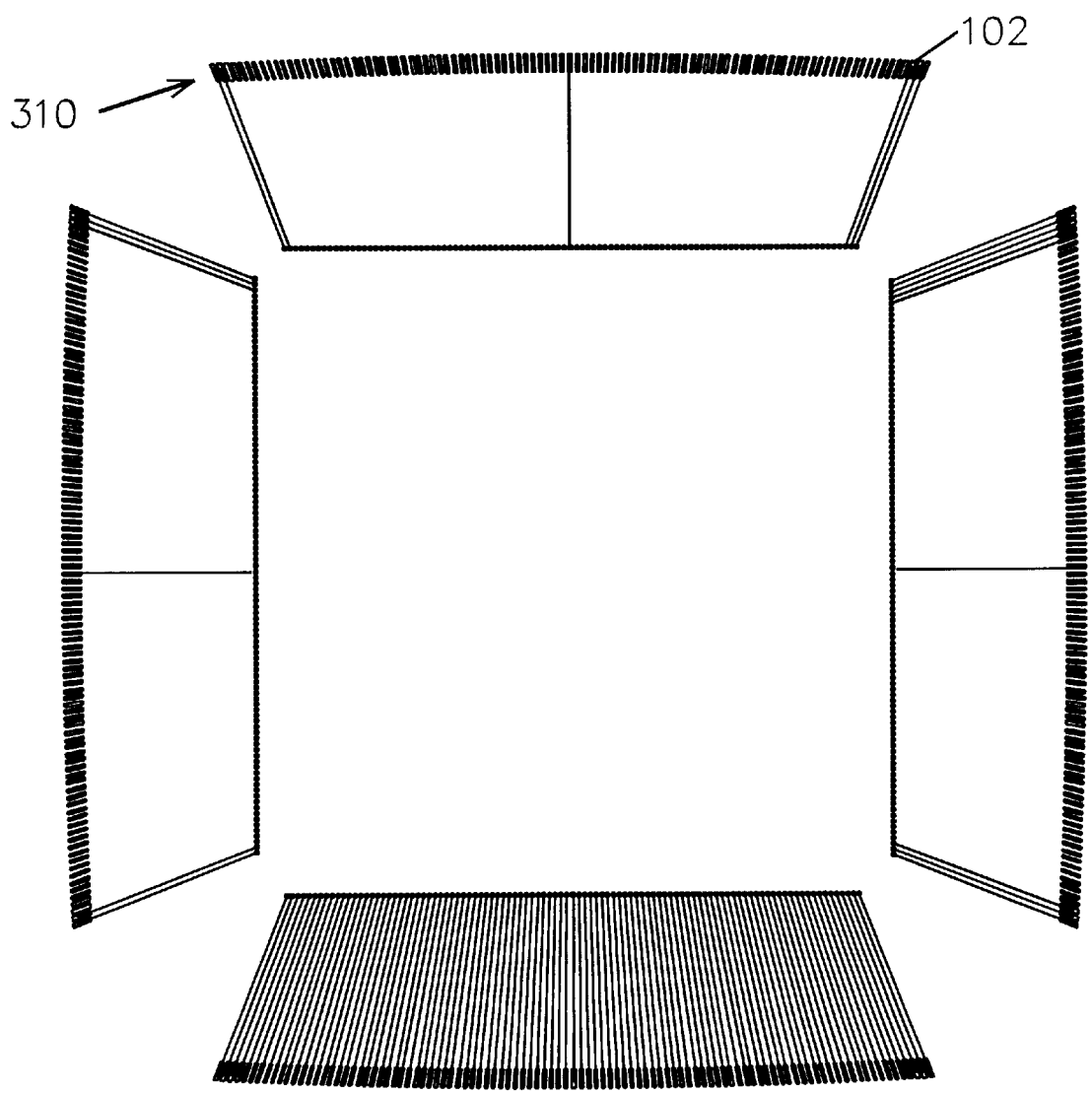
FIG. 5 is a topographical view of a substrate showing constant bond length finger placement as in the prior art.
Figure 6:
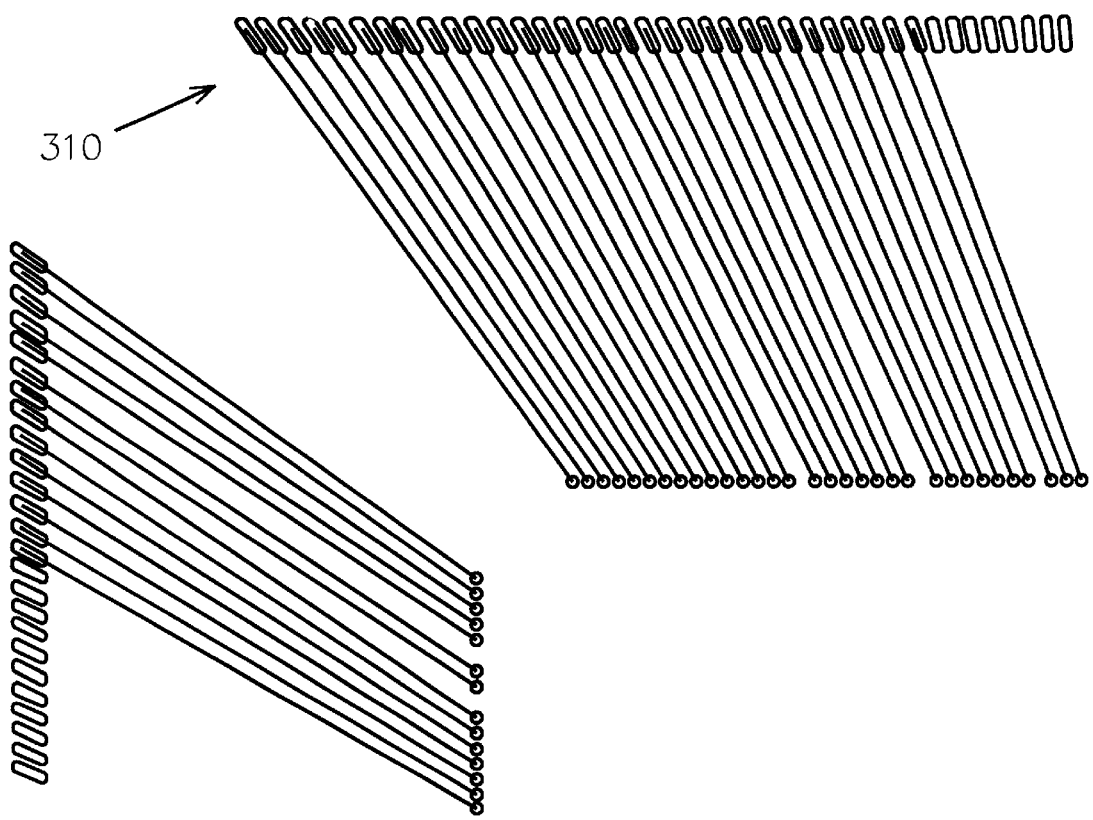
FIG. 6 is a zoom-in of the upper left quadrant of the topographical view of FIG. 5.

Depending upon the style under which the wire bond fingers are generated, there will be different key parameters. One style under which fingers can be placed is referred to as constant bond length (CBL). With this layout, all fingers lie a specific distance from their chip I/O mate, as is illustrated in FIGS. 5 and 6. The key parameters for CBL are finger pitch, wire bond length, and maximum finger angle. An example screen for finger data simulation generated using constant bond length criteria is illustrated in Table 1:

TABLE 1

FINGER DATA FOR CONSTANT BOND LENGTH

| Finger Pitch | Wire Bond Length | Max Finger Angle |
| --- | --- | --- |
| 12.0 | 180 | 36 |
| 12.0 | 178 | 37 |
| 12.0 | 176 | 37 |
| 12.0 | 174 | 38 |
| 12.0 | 172 | 38 |
| 12.0 | 170 | 39 |
| 12.0 | 168 | 39 |
| 12.2 | 180 | 38 |
| 12.2 | 178 | 38 |
| 12.2 | 176 | 39 |
| 12.2 | 174 | 39 |
| 12.4 | 180 | 39 |

In the example of Table 1, the designer specified the maximum acceptable finger angle as 40.0 degrees. With a finger pitch of 12.0, there are seven possible solutions ranging from a wire bond length of 180 units down to 168 units. With a finger pitch of 12.2, there are four possible solutions, and only a single solution available using a finger pitch of 12.4 units.

Optimal finger layout styles provided in accordance with the preferred embodiment of the invention include arc of circle and encompassing rectangle styles.

Figure 7:
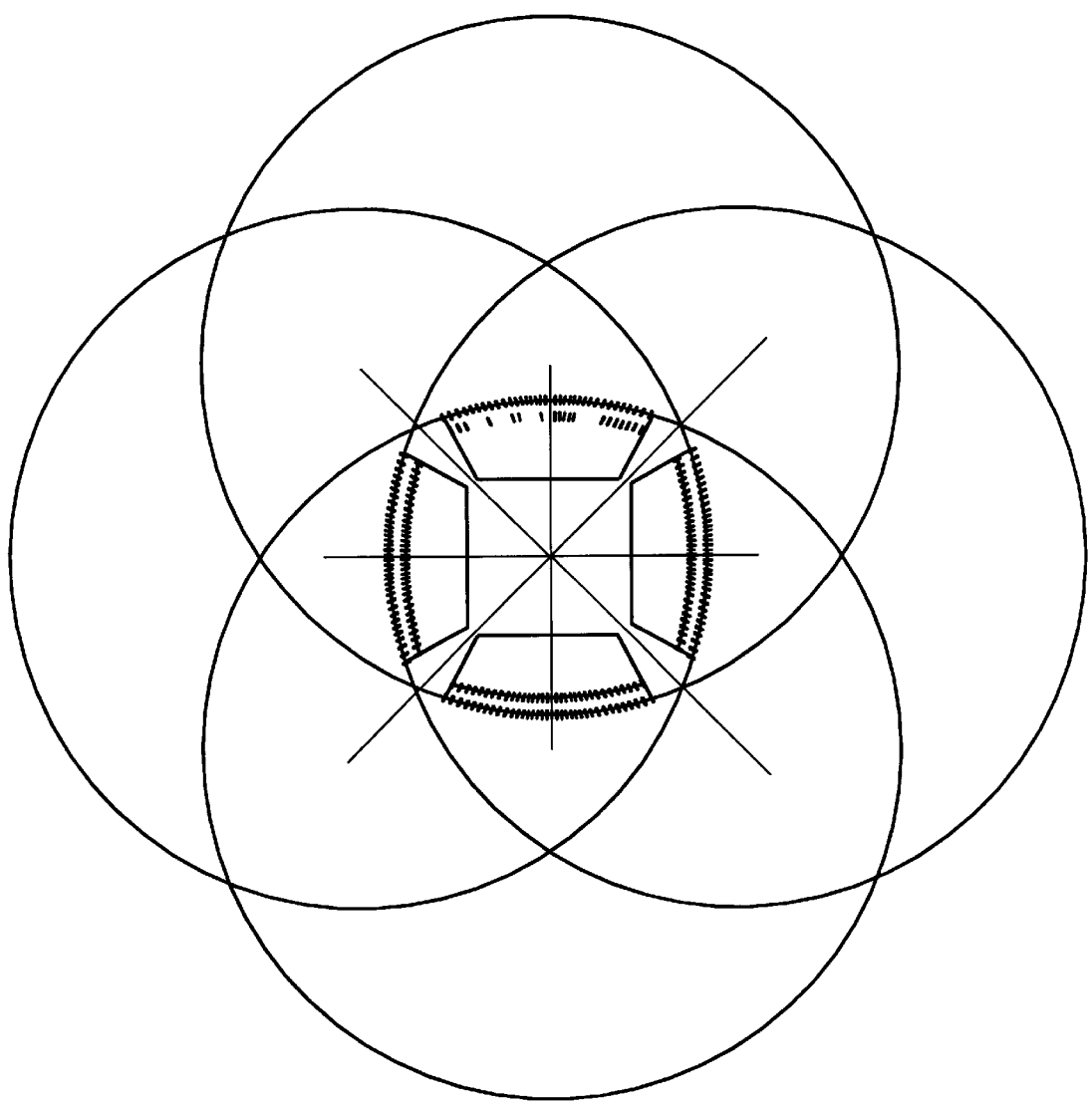
FIG. 7 is a topographical view of a substrate showing arc of circle finger placement according to the preferred embodiment of the invention.
Figure 8:
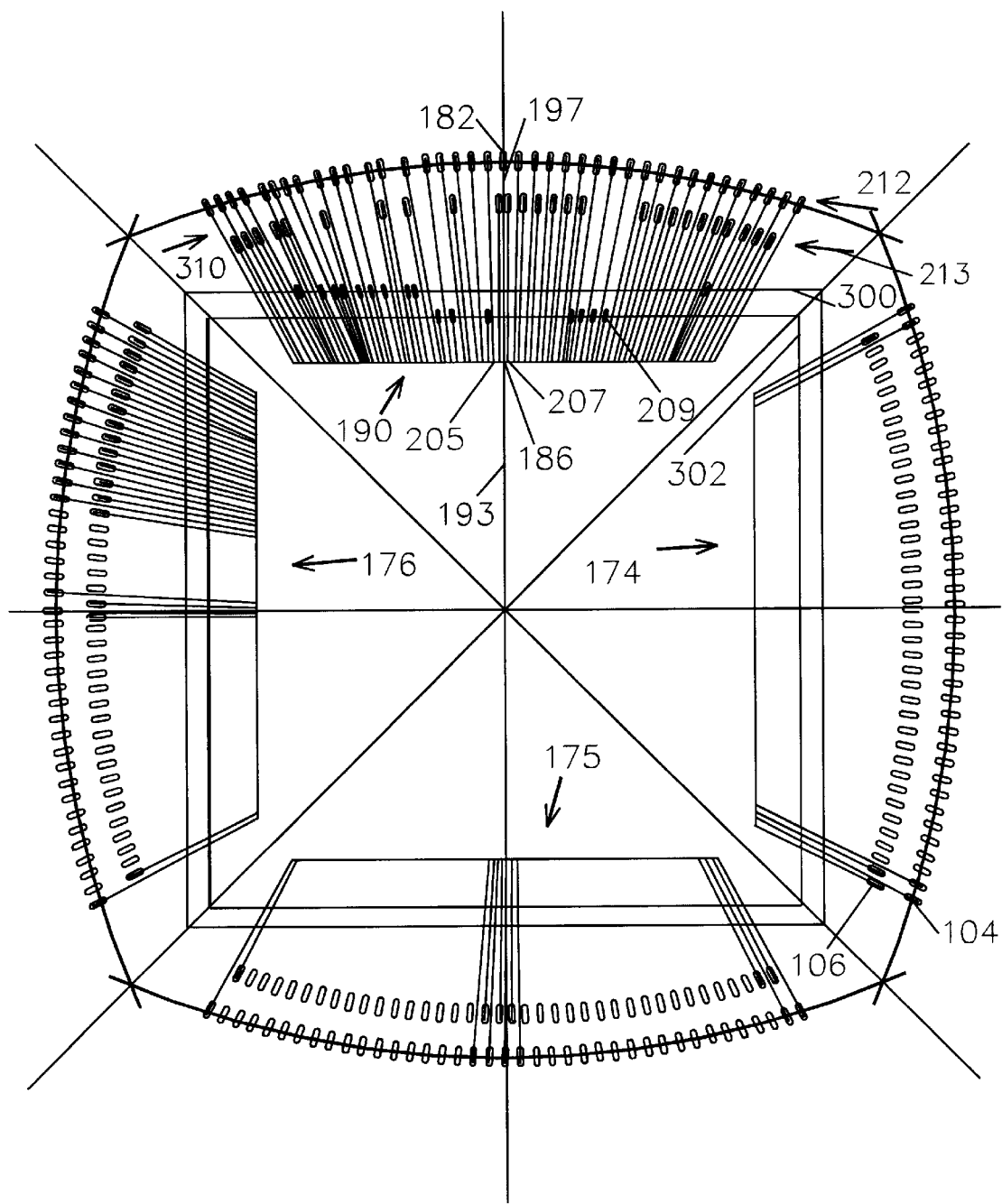
FIG. 8 is a zoom-in of the arc of circle topographical view of FIG. 7.
Figure 9:
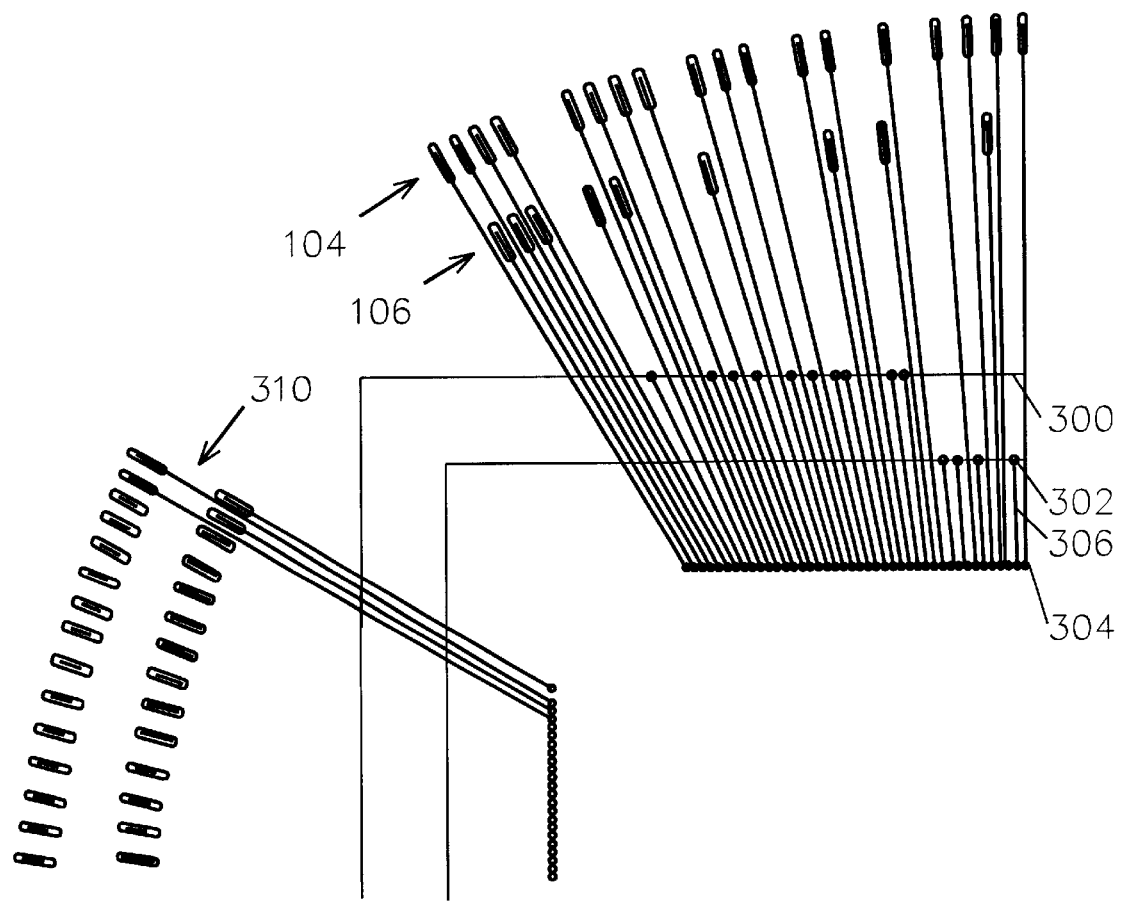
FIG. 9 is a further zoom-in of the upper left quadrant of the arc of circle topographical view of FIGS. 7 and 8.

Referring to FIGS. 7–9, a diagram illustrates arc of circle. For each side (north, east, south and west), the fingers lie along the arc of a circle. While there are in fact four different circles, the circles are similar in size with differing center points.

Figure 10:
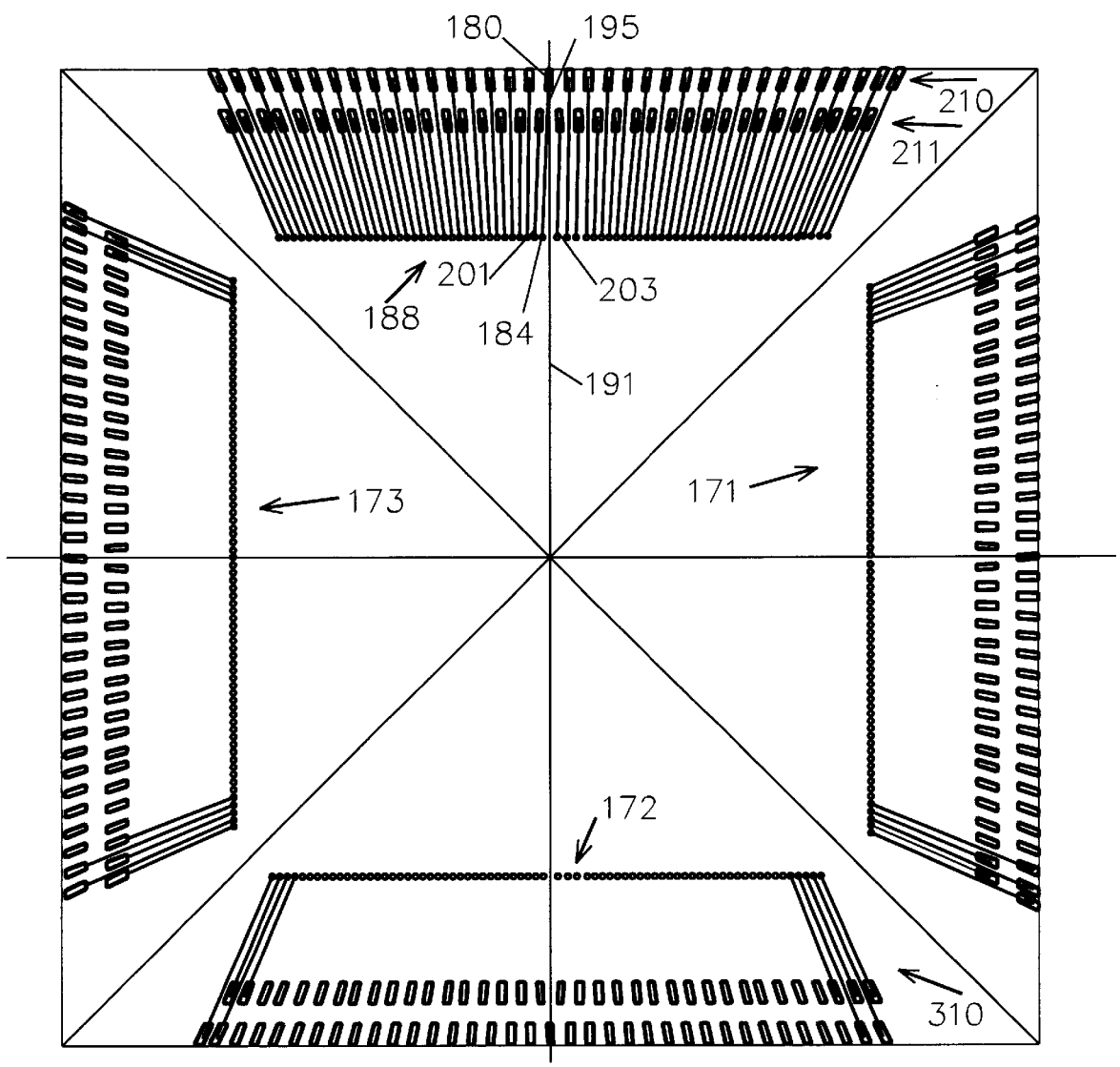
FIG. 10 is a topographical view of a substrate showing encompassing rectangle finger placement according to the preferred embodiment of the invention.
Figure 11:
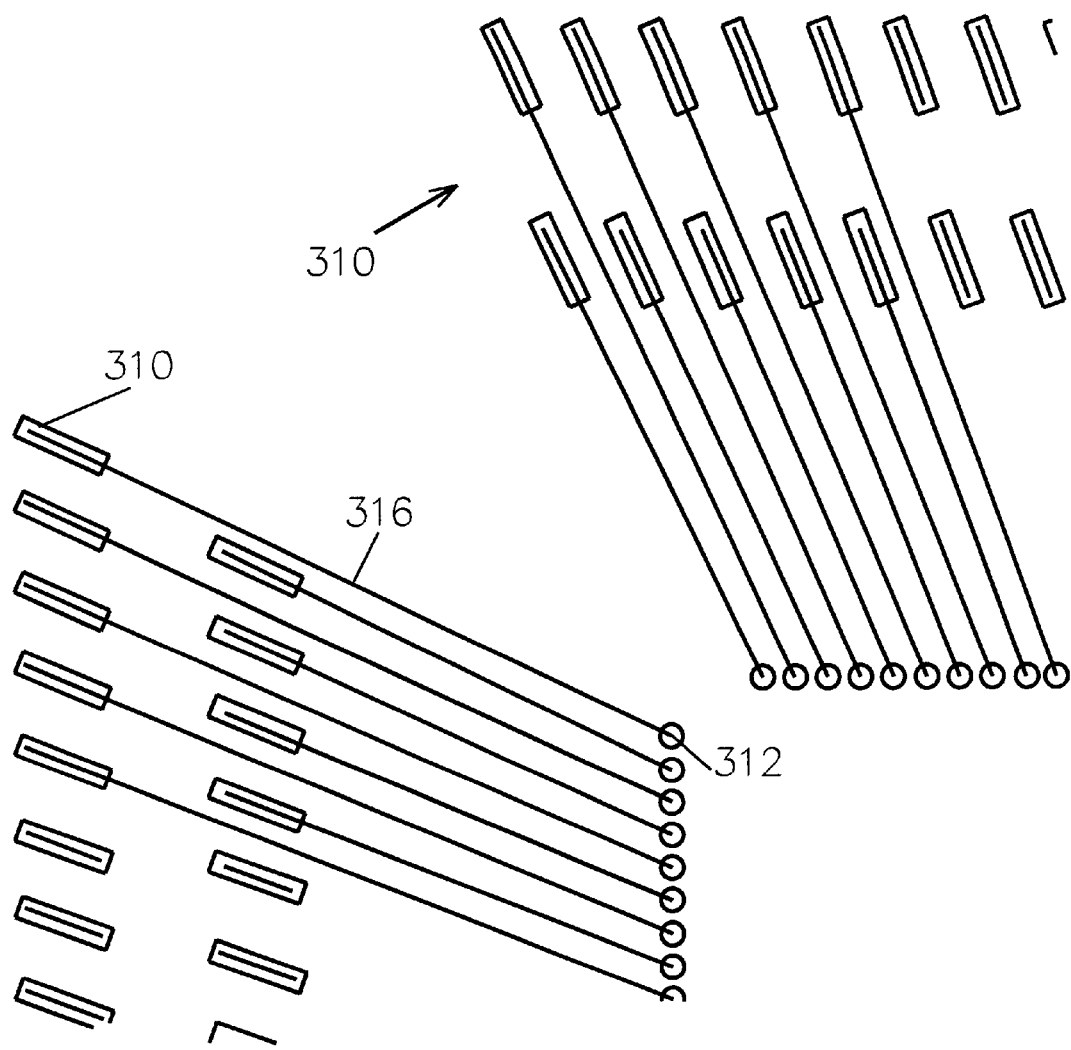
FIG. 11 is a zoom-in of the upper left quadrant of the encompassing rectangle topographical view of FIG. 10.
Figure 12:
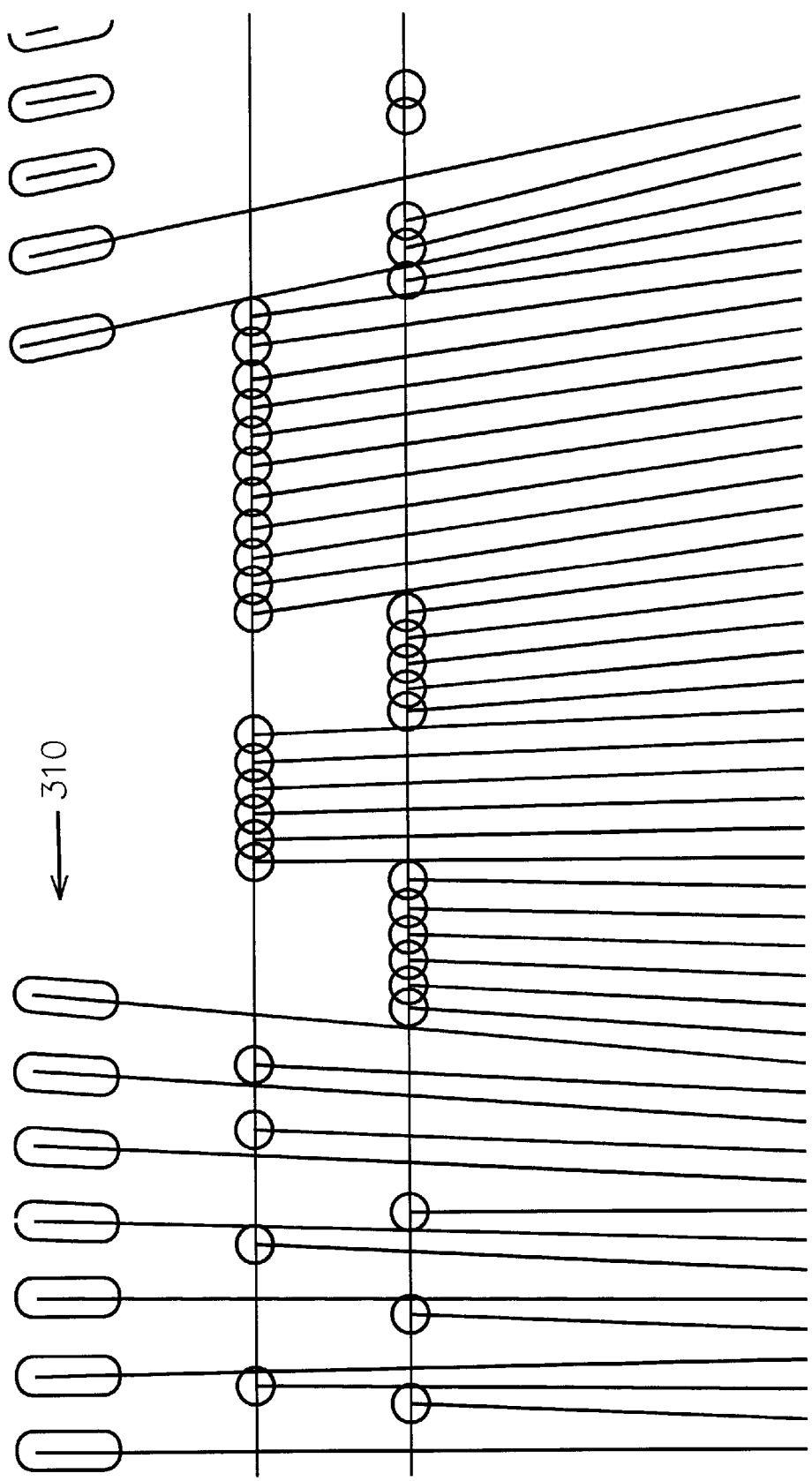
FIG. 12 is a topographical view of finger placement illustrating a larger number of chip I/Os tied to voltage rings causing the fingers on either side to converge.

Referring to FIGS. 10 and 11, a diagram illustrates encompassing rectangle. The outer row of fingers is restricted to lying within the rectangle specified by the user. This finger style additionally can enforce a maximum wire bond length, similar to CBL in which case the outer row of fingers could butt up to the encompassing rectangle or pull inwards toward the chip I/O.

With respect to voltage rings, a user identifies the voltage ring locations along with the voltage netname. With the location and value of a voltage ring in combination with an input chippad netlist dataset, sufficient information is provided for the wire bond finger application of the preferred embodiment of the invention to identify chip I/O pads which must terminate at a voltage ring and to wire the connection appropriately.

FIGS. 7–9 illustrate the fingers placed along arc of circle. The designer inputs to the application program implementing the preferred embodiment of the invention the circle center and radius, the application program calculates the circle and places the fingers along the respective circle.

FIGS. 10–11 illustrate the encompassing rectangle. The designer inputs the perimeter of the rectangle: corner, width and height. The application program then generates the fingers to lie within the rectangle.

Referring FIG. 1, the method steps of the preferred embodiment of the invention are set forth.

Figure 14:
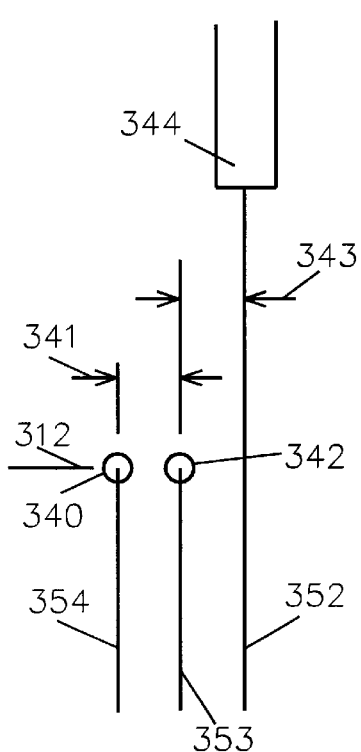
FIG. 14 is a schematic view illustrating relative positions of bond wires to voltage ring points and fingers.
Figure 15:
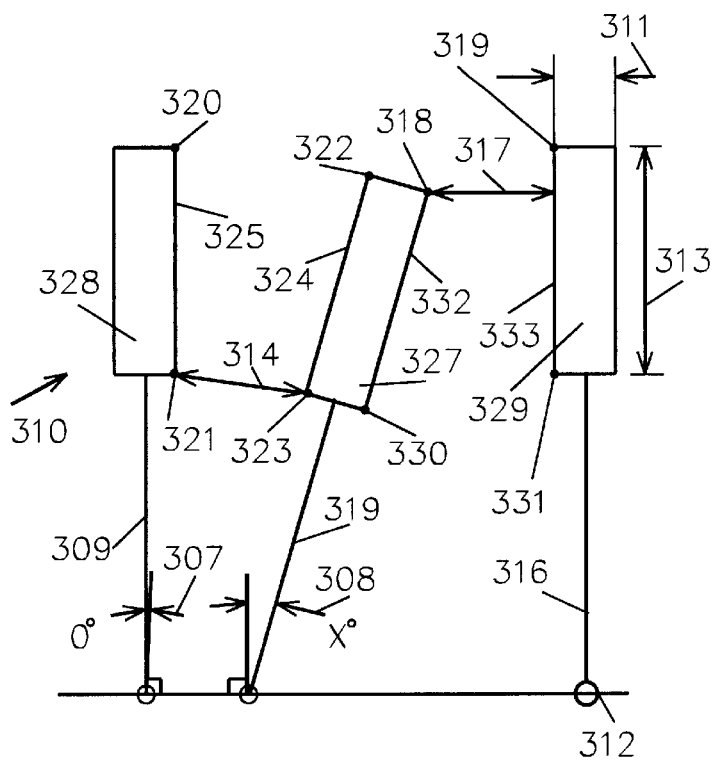

In step 100, the program is started and by way of a graphical user interface collects from the user designer finger generation parameters, including the following:
1. Number of rows of fingers.
    The preferred embodiment provides for one or two rows. FIGS. 5 and 6 show one row 102. FIG. 8 shows two rows 104 and 106.
2. Finger style.
    The preferred embodiment provides for arc of circle (FIG. 8), constant bond length (FIG. 5) and encompassing rectangle (FIG. 10).
3. Location and value of optional voltage rings.
4. Is net list available.
    A net list is a file which shows the locations of all chip pads.
5. If a net list is available, it contains the location and voltage value of chip pads. If not, then the user must input location of the first and last chip pads, and the number of chip pads for a given side.
    Referring to FIGS. 8 and 9, voltage rings 300 (for example, a ring at a first voltage Vcc) and 302 (for example, a ring at a second value Vtt) are on the chip carrier. Chip pad 304 is connected by bond line 306 which terminates at voltage ring 302.
6. Dimensions of output fingers.
    Fingers 310 are shown in each of the drawings.
    Referring to FIG. 15, the dimensions provided are length 313 and width 311. These fingers 310 are wire bond pads located on a chip carrier surface, and tend to be long (313) and narrow (311) for wire 316 attachment. A bond line 316 interconnects a finger 329 and a chip bond pad 312 which is on the chip. Herein, bond line 316 is a discrete, physical wire on a substrate which connects two bond pads 312 and 329. (Fingers 310 are also referred to as bond pads.)
7. Minimum finger spacing.
    Referring to FIG. 15, minimum spacing 314 or 317 is the distance between adjacent fingers in the outer row at their closest points, which for fingers pair 327 and 328 will be from one of points 320–323 to the closest point on the opposing sides 324 or 325, and similarly for fingers pair 327 and 329. In the fan in situation illustrated by fingers 327 and 329, the point selected for determining minimum spacing 317 will be one of 318 or 319, inasmuch as the bond lines 316 and 319 are fanning in (converging) at the outer fingers 327, 329. Normally, however, the bonds lines 309, 319 are fanning out (diverging), and one of points 321, 323 will be selected to determine minimum spacing (the closest distance to the closest side of the adjacent finger).
8. Maximum finger angle.
    Referring to FIG. 15, finger angles 307, 308 of 0 degrees and x degrees, respectively, are illustrated. This parameter specifies xmax.
9. Minimum adjacent bond spacing 341 at voltage rings.
    Referring to FIG. 14, the minimum spacing 341 between bond line terminations 340 and 342 at a voltage ring, such as ring 312.
10. Other minimum spacings 343 and 426 at voltage rings.
    There are two situations which are accommodated. First, referring to FIG. 14, dimension 343 shows the case where a finger bond line 352 is adjacent to a voltage ring termination 342 at voltage ring 312. Second, referring to FIG. 18, dimension 426 shows the case where a finger bond line 423 is adjacent to a finger bond line 421, and 426 is the distance between points 424 and 425 on voltage line 302 at the intersection with bond lines 423 and 421 respectively.

In step 110, the user inputs whether to do a single solution or some plurality of n solutions, the latter of which is referred to as a simulation.

Figure 13:
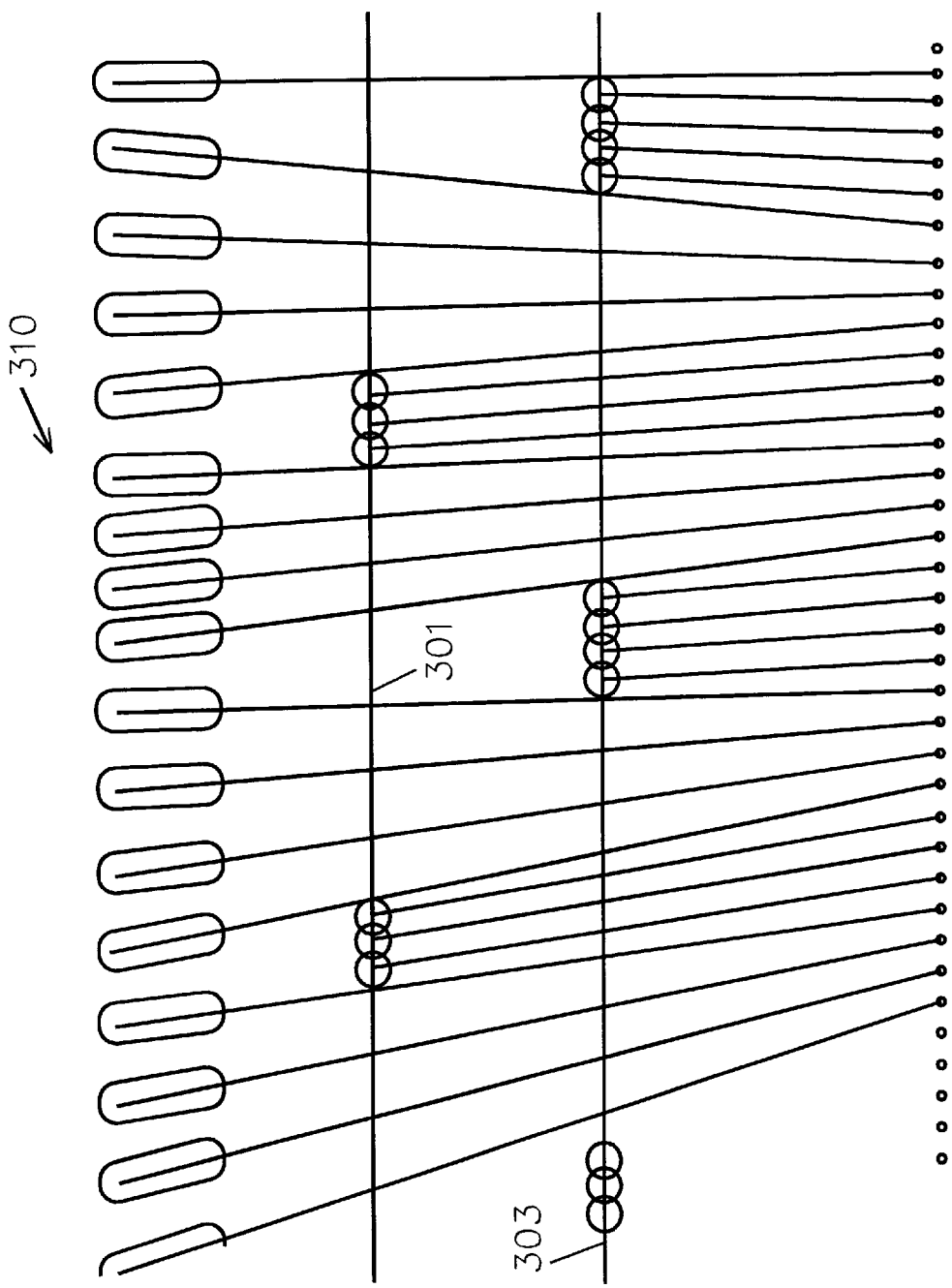
FIG. 13 is a topographical view also illustrating converging of bond wires to fingers on either side of voltage ring points.

In step 120, the application generates output data describing the graphical location of the fingers for a single solution, if such a solution exists, as further described in connection with FIG. 13.

In step 130, the application generates output data giving possible solutions, the first derived from the tightest parameters or tolerances input by the user. The application iterates on these parameters, opening up on the tolerances to evaluate possible solutions with gradually relaxed tolerances. A report is then produced listing (such as is illustrated in Table 1) up to, for example, 100 solutions which satisfy all input parameters.

In step 140, the designer is prompted to select one of the candidate solutions from the list, by deciding which of these solutions is optimal, generally expected to be based upon the solution selected being well within tolerances on all most critical parameters. The definition of which parameters are most critical may vary from application to application. In response to the user's selection, the application executes step 120, supra.

In step 150, a test is made to see if there is a solution for the set of parameters input to step 120. This would fail (return code RC !=0) if in the course of placing any finger a violation of the input criteria (from steps 100 or 160) occurs.

In step 160, a solution not having been found, the user is given the opportunity to adjust one or more input parameters (see step 100) and request an evaluation of an alternate solution.

In step 170, output of fingers data for a successful solution is provided in one of GL/1 (graphics language/1), Cadence or Autocad format.

Figure 2:
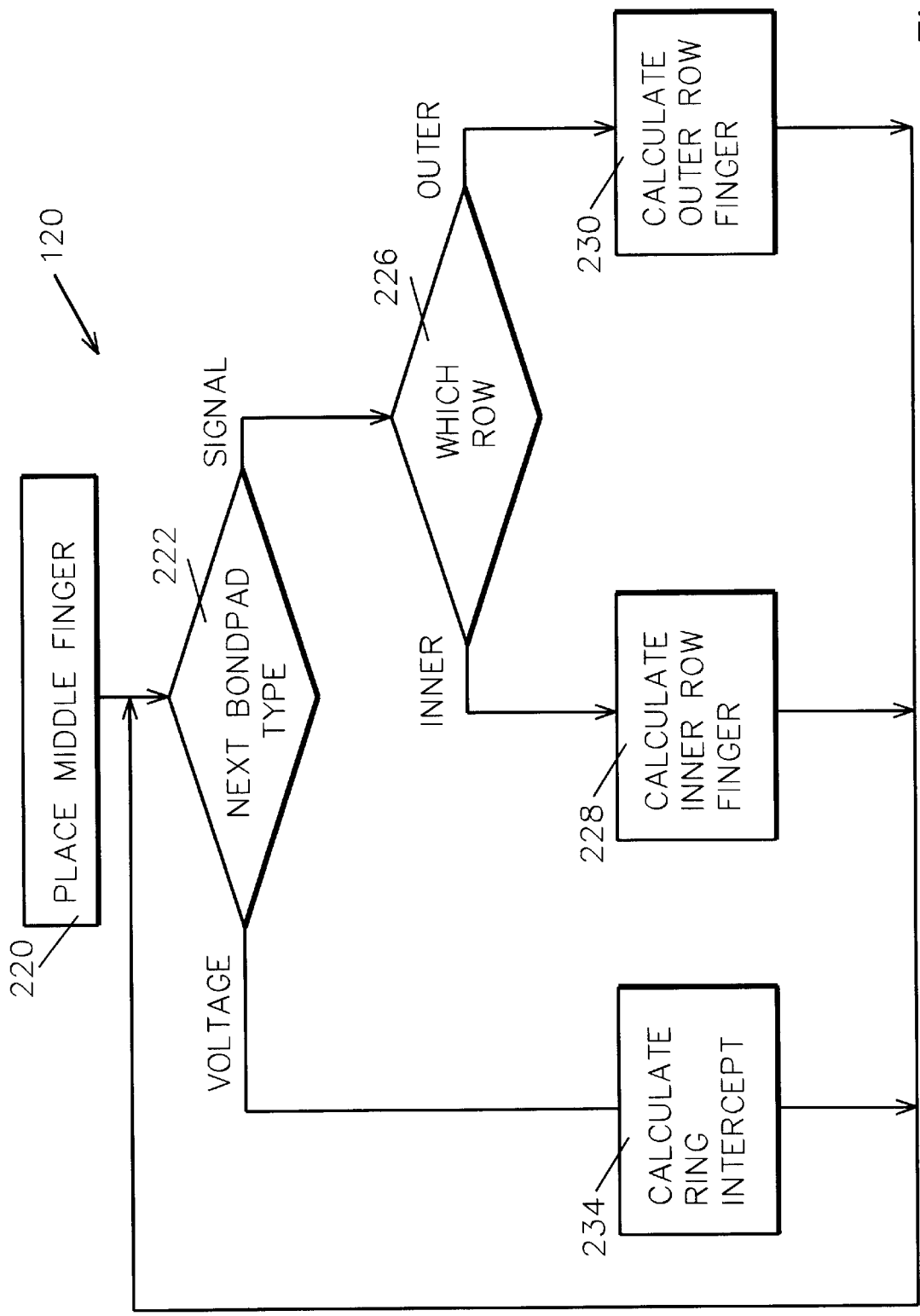
FIG. 2 is a flow diagram illustrating the solution generation step 120 of FIG. 1.

Referring to FIG. 2, step 120 is illustrated in greater detail.

Referring to FIG. 10, for the encompassing rectangle, and to FIG. 8 for the arc of circle, in step 220, to place the middle finger 180, 182, the middle chip pad 184, 186 of a side 188, 190 is identified and becomes the chip pad of the first finger 180, 182 generated for that side. (For this side, during the first iteration of step 220, the middle chip pad is selected as chip pad number m/2, where m is the number of chip pads on a side). That chip pad 184, 186 is initially selected as the middle chip pad, and bond line 195, 197 is generated from that middle straight out to terminate either at a finger 180, 182. From this middle pad 184, 186, in step 222 processing fans out to the left 201, 205 and right 203, 207, one pad at a time. This process repeats for each of sides north 188, 190, east 171, 174, west 173, 176 and south 172, 175.

Once the fingers are generated for a side, in subsequent iterations of step 220, when rebalancing is turned on, the chip I/O selected as the middle may have to be adjusted to the left or right by one pad, and the fingers for that side are recalculated to balance the angle of the outer most fingers on the left and the right.

In step 222, the next bond pad is identified as a voltage or a signal by taking the net name associated with the bond pad and comparing it with the list of voltage net names identified by the user in step 100.

In step 226, for signal pads, it is determined if the next finger to be processed in sequential order, alternatively from the middle finger to the left and right, is in outer row 210, 212 or inner row 211, 213; and step 228 (FIG. 3) is executed to calculate a finger in an inner row, and step 230 (FIG. 4) is executed for a finger in an outer row.

Referring to FIG. 14 in connection with FIG. 2, in step 234, for voltage pads, the voltage ring intercept for determining finger pitch 341, 343 is calculated. Referring to FIGS. 9 and 13, the voltage ring intercept for measuring finger pitch for fan out will be at the innermost ring 302, and for fan in at the outermost voltage ring 300.

Figure 3:
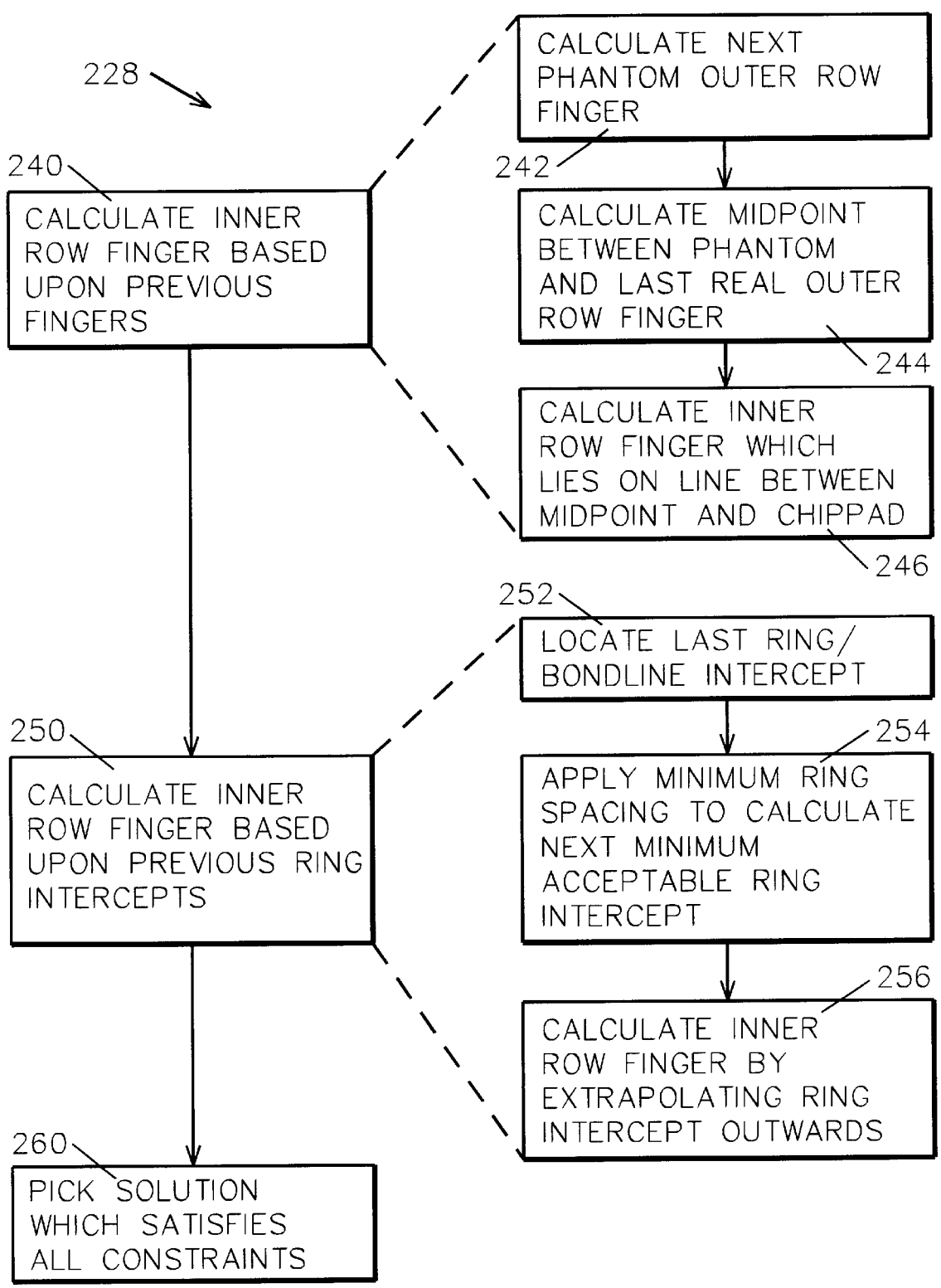
FIG. 3 is a flow diagram illustrating the calculate inner row finger step 228 of FIG. 2.
Figure 16:
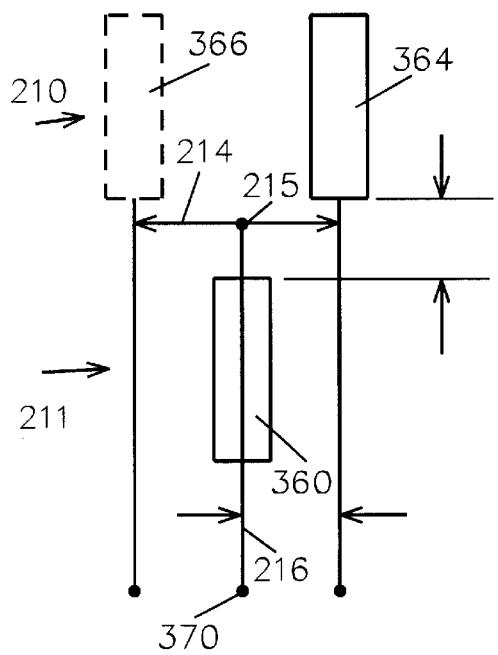
FIG. 16 is a schematic view illustrating placement of an inner row finger with respect to an outer row finger.

Referring to FIG. 16 in connection with FIG. 3, steps 240 and 250 will be executed as part of the finger placement logic for placing an inner row finger, but only one of these will yield an appropriate solution. Step 260 will determine which solution to use.

In step 240 the placement of an inner row 211 finger 360 is calculated based upon the placement of previous outer row finger 364. Finger 364 will have been placed on outer row 210 inasmuch as signal pads are placed on alternating rows. This is done as shown in steps 242, 244 and 246. In step 242, the next phantom finger 366 on outer row 210 is placed at a pitch 214. In step 244, the midpoint 215 is determined. In step 246, finger 360 is placed on the line 216 which begins at midpoint 215 and terminates at the chip pad 370 for this connection (i.e., finger) 360. Pitch 214 is initially determined from the input parameters entered in step 100; when doing simulations, it is one of the parameters gradually or incrementally altered in step 130 for identifying possible solutions. Hereafter, in accordance with an alternative embodiment, the placement of inner finger 360 may have to be altered if, in subsequent processing, it is determined that the next outer row finger is not placed at the position calculated for phantom finger 366.

In step 250, the next inner row finger placement is calculated. (Fingers are placed on inner and outer rows alternatively.)

Figure 17:
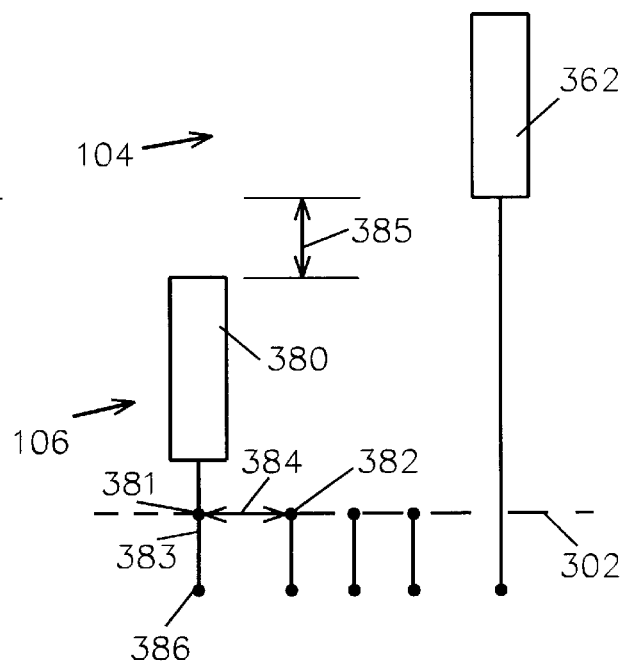
FIG. 17 is a schematic view illustrating placement of an inner row finger with respect to a bond wire to a voltage ring.

In step 252, referring to FIG. 17, in placing inner row finger 380, the position of the last voltage termination 382 is determined.

In step 254, the minimum spacing 384 is applied to calculate the next intercept 381 (a point lying along voltage ring 302 which utilizes the tightest possible spacing tolerance).

In step 256, a line drawn from chip pad 386 extending outward through point 381 is used to position this finger 380 on the inner row 106 at a predetermined distance 385 inward from the outer row 104.

In step 260, two possible solutions for placement of this inner finger (steps 240 and 250, yielding inner fingers 360 and 380 at the positions shown in FIGS. 16 and 17, respectively) have been determined. The solution which satisfies all constraints is selected. In the preferred embodiment, the calculations of both step 240, yielding the result shown in FIG. 16, and step 250, yielding the result shown in FIG. 17, are performed. FIG. 16 illustrates the situation where the inner finger 360 is being placed next to a bond line terminating in finger 364, and FIG. 17 illustrates the situation where inner finger 380 is being placed next to a bond line terminating at ring intercept 382. In the situation where step 240 is executed with respect to the pattern shown in FIG. 17, inner finger 380 would have been placed with respect to outer finger 362, yielding a position too far to the right, and this solution would not be selected. Similarly, when step 250 is executed with respect to the pattern shown in FIG. 16 (that is, with respect to previous ring intercepts not shown), inner finger 360 would be improperly positioned and this solution rejected in step 260.

Figure 4:
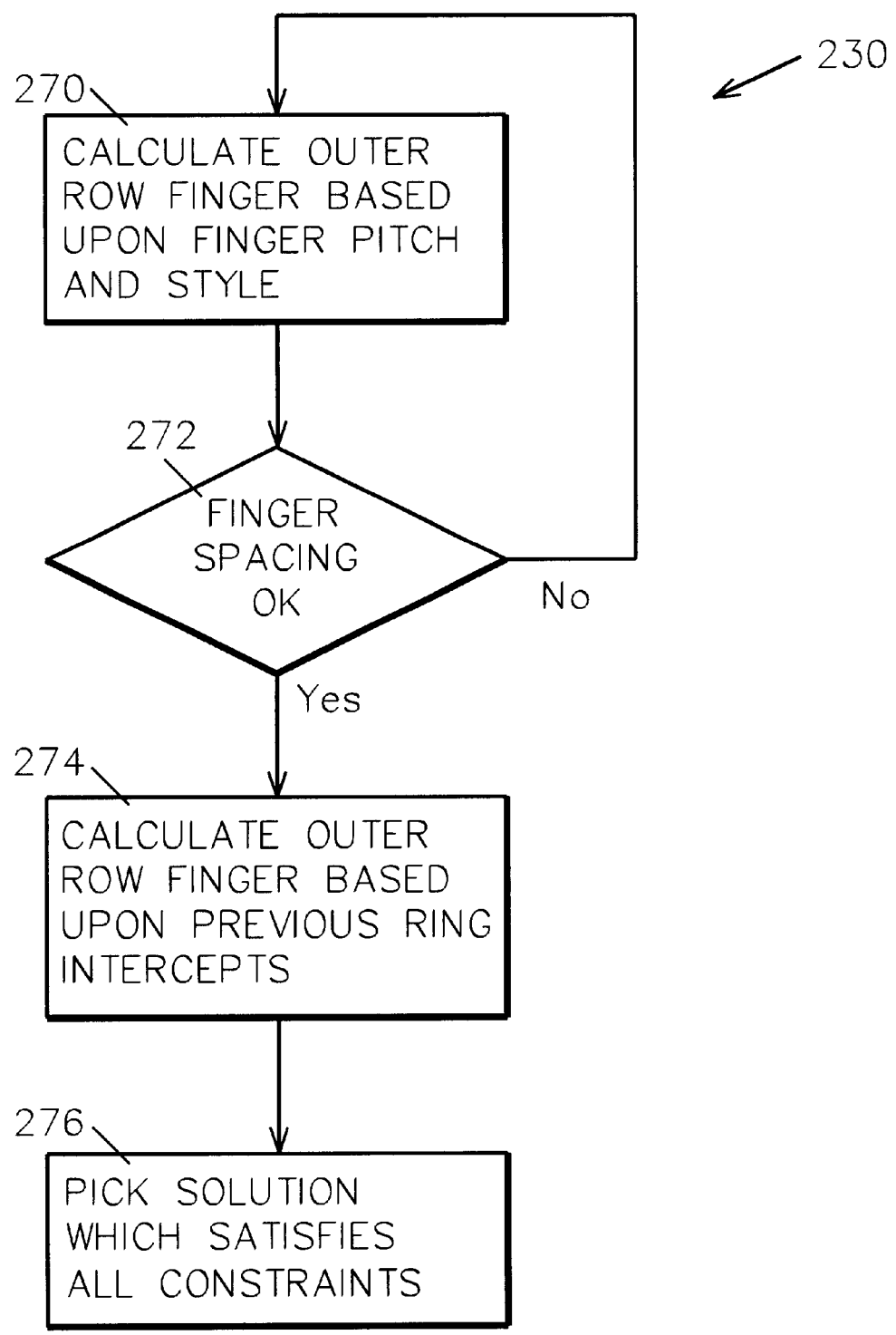
FIG. 4 is a flow diagram illustrating the calculate outer row finger step 230 of FIG. 2.

Referring to FIG. 4, step 230 for calculating a next outer finger is further described.

In step 270, outer row finer placement is calculated based on outer row finger pitch and the appropriate one of styles: encompassing rectangle, constant bond length, or arc of circle.

In step 272, referring to FIG. 15, finger spacing is checked for this finger pair. Fingers 328 and 327 illustrate a finger pair in a fan out orientation, and fingers 327 and 329 illustrate a finger pair in a fan in orientation. Considering finger pair 328/327, each corner 320, 321, 322 and 323 on facing sides 325 and 324, respectively, is checked with respect to the adjacent finger side and if spacing is violated, the spacing is incremented until minimum spacing is satisfied. As illustrated, the minimum distance between fingers 328 and 327 occurs at 314, and finger 328 is positioned so that dimension 317 satisfies the spacing criteria. Considering finger pair 327/329, each corner 318, 330, 319 and 331 is checked with respect to the distance to opposing side 332 or 333, as the case may be, and the shortest distance 317 selected for satisfying the spacing criteria.

Figure 18:
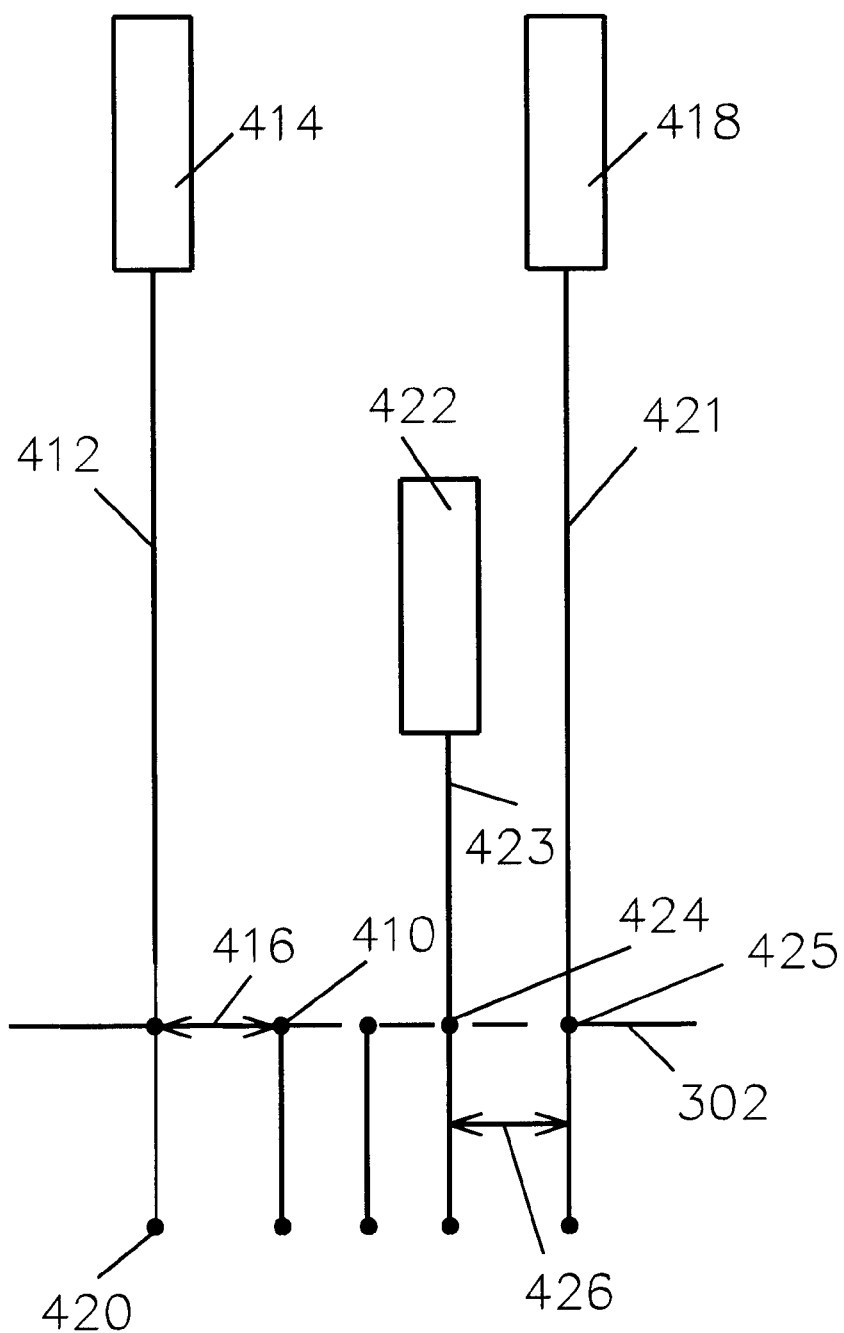
FIG. 18 is a schematic view illustrating positions of bond wires to voltage line points and fingers.

In step 274, referring to FIG. 18, this next outer ring finger 414 is calculated based on a last ring intercept 410. A predetermined minimum spacing 416 establishes the position on ring 302 where the line 412 interconnecting chip pad 420 with outer row finger 414 must cross, and this new outer ring finger 414 placed based on projection of line 412 to the outer row.

In step 276, the solutions from steps 270 and 274 are evaluated, and that which satisfies all constraints selected. In the case where the previous bond line terminated at a voltage ring, the solution selected will be that which is illustrated in FIG. 18. In the case where the previous bond line terminated at an inner row finger, the solution selected will be one (depending upon fan in or fan out) which is illustrated in FIG. 15.

Advantages Over the Prior Art

It is an advantage of the invention that there is provided an improved system and method for the placement of fingers on a substrate carrier.

It is a further advantage of the invention that there is provided finger layout styles which achieve optimal finger layout, particularly in the corners.

It is a further advantage of the invention that there is provided a system and method for accommodating the layout of chippads on non-symmetrical sides.

It is a further advantage of the invention that there is provided a system and method for accommodating the layout of chippads which are not uniformly spaced.

It is a further advantage of the invention that there is provided a system and method for automatically wiring chip I/O pads to voltage rings.

It is a further advantage of the invention that there is provided a system and method for increasing designer productivity and for using new finger layout patterns which most effectively make use of available real estate for interconnect wiring between chip and chip carrier.

It is a further advantage of the invention that there is provided a system and method which advances the state of the art with regard to generation of wire bond finger data for chip carriers by improving designer productivity by automating activities previously done manually; improving manufacturability and reliability of the resultant product through the use of new finger layout styles; and optimize the use of available real estate via implementation of the new finger layout styles and the automatic wiring of chip I/O pads to voltage rings.

Alternative Embodiments

It will be appreciated that, although specific embodiments of the invention have been described herein for purposes of illustration, various modifications may be made without departing from the spirit and scope of the invention. In particular, it is within the scope of the invention to provide a program storage or memory device such as a solid or fluid transmission medium, magnetic or optical wire, tape or disc, or the like, for storing signals readable by a machine for controlling the operation of a computer according to the method of the invention and/or to structure its components in accordance with the system of the invention.

Further, each step of the method may be executed on any of general computer, such as an IBM System 390, AS/400, PC or the like and pursuant to one or more, or a part of one or more, program modules or objects generated from any programming language, such as C++, Java, Pl/1, Fortran or the like. And still further, each said step, or a file or object or the like implementing each said step, may be executed by special purpose hardware or circuit module designed for that purpose.

Accordingly, the scope of protection of this invention is limited only by the following claims and their equivalents.

We claim:

1. Method for defining chip carrier topology for positioning outer fingers within the cavity of a chip carrier, comprising the steps of:

first collecting from a user selective values and ranges of values for topology parameters, said topology parameters including inner chip pad locations and finger style, said finger style selectively including arc of circle, least encompassing rectangle, and constant wire bond length finger patterns;

second generating and displaying to a user a plurality of topology solutions for positioning said outer fingers satisfying said topology parameters, said second generating step including recursively generating outer finger locations within said cavity by iteratively relaxing and tightening tolerances on selected said topology parameters to define a plurality of topology solutions satisfying said values and ranges of values for said topology parameters;

third receiving from said user selected values for a user selected topology solution selected from said values and ranges of values for said plurality of possible topology solutions; and fourth generating from said user selected topology solution an output file representing said user selected topology solution.

2. The method of claim 1, comprising the further steps of:

fifth displaying to said user said user selected topology solution; and sixth selectively receiving from said user input adjusting said user selected values and repeating said fourth step of generating said output file.

3. The method of claim 1, said topology parameters comprising:

finger to finger spacing;

voltage bond to voltage bond spacing; and voltage bond to adjacent finger wire spacing as measured at a voltage ring;

and further comprising a plurality of parameters selected from the set including:

the number of rows of fingers;

the spacing between rows of fingers;
finger style, said finger style being one of arc-of-circle, constant-bond-length, and least-encompassing-rectangle;
location of voltage rings;
value of voltage rings;
location of chip pads;
voltage of chip pads;
dimensions of output fingers;
minimum finger pair spacing;
maximum finger angle with respect to its bond line;
minimum spacing of adjacent bond lines both terminating at the same voltage ring; and
minimum spacing of other wiring at said voltage ring.

4. The method of claim 1, said topology including a plurality of bond lines radiating from a line of chip pads to a plurality of finger or voltage lines, said fourth step further comprising the steps of:
eighth placing a middle finger with respect to a middle chip pad;
ninth processing alternative chip pads to the right and left sequentially from said middle chip pad selectively to position ring intercepts, inner row fingers and outer row fingers.

5. The method of claim 4, the positioning of ring intercepts further comprising the steps of:
selectively for fan out, setting finger pitch at the inner most ring;
selectively for fan in, setting finger pitch at the ring of termination.

6. The method of claim 4, the positioning of inner row fingers further comprising the steps of:
calculating a first inner row finger position with reference to the previously positioned outer row finger;
calculating a second inner row finger position with reference to the previously positioned ring intercept; and
selecting which of said first inner row finger position and said second inner row finger position satisfies all constraints.

7. The method of claim 6, said step for calculating a first inner row finger position comprising the further steps of:
calculating a next phantom outer row finger location, said next phantom outer row finger location representing a best guess estimate of a finger which may or may not exist;
determining a midpoint between said phantom outer row finger location and the last outer row finger location;
determining the position of said first inner row finger along the line segment connecting said midpoint and the chip pad for said first inner row finger; and
responsive to determining that said phantom finger exists, selectively adjusting the position of said first inner row finger.

8. The method of claim 6, said parameters including selection of layout style as arc of circle, or least encompassing rectangle, or constant bond length; and said step for calculating a second inner row finger position comprising the further steps of:
locating the last ring bondline intercept;
applying a minimum ring intercept spacing parameter to locate on said ring the next minimum acceptable ring intercept; and
determining the position of said second inner row finger position by extrapolating out to the inner row the line segment connecting next minimum acceptable ring intercept and the chip pad for this inner row finger.

9. The method of claim 4, the positioning of outer row fingers further comprising the steps of:
calculating this outer row finger first location with reference to finger pitch and topology style parameters;
calculating this outer row finger second location with reference to the previous ring intercept; and
selecting which of said first location and second location satisfies all constraints.

10. The method of claim 4, said chip topology including a plurality of sides, further comprising the steps of repeating said eighth and ninth steps for each of said plurality of sides.

11. The method of 9, said topology style parameter defining one of arc-of-circle, constant-bond-length, and encompassing-rectangle for placing outer row fingers.

12. System for defining chip carrier topology, comprising:
a first module including a graphical user interface for collecting topology parameters from a user, said parameters including inner chip pad locations and finger style, said finger style selectively including arc of circle, least encompassing rectangle, and constant wire bond length finger patterns;
a second module for generating and displaying to said user a plurality of possible topology solutions for placing fingers in a plurality of rows of bond pads within a quadrant of said chip carrier, said second generating step including recursively generating outer finger locations within said cavity by iteratively relaxing and tightening tolerances on selected said topology parameters to define a plurality of topology solutions satisfying said values and ranges of values for said topology parameters;
a third module for enabling said user to select from said plurality of possible topology solutions a user selected solution;
a fourth module for generating from said user selected solution an output file.

13. The system of claim 12, further comprising:
said parameters including layout style;
a fifth module for displaying to said user said output file for evaluating said topology solution; and
a sixth module for adjusting said topology parameters and repeating said fourth step of generating said output file.

14. The system of claim 13, said topology including a plurality of bond lines radiating from a line of chip pads to at least one finger or voltage line alone an arc of circle, least encompassing rectangle, or constant bond length line, said fourth module further comprising:
an eighth module for placing a middle finger with respect to a middle chip pad; and
a ninth module for processing alternative chip pads to the right and left sequentially from said middle chip pad selectively to position ring intercepts, inner row fingers and outer row fingers.

15. A program storage device readable by a machine, tangibly embodying a program of instructions executable by a machine to perform method steps for defining outer finger placement topology, said method steps comprising:
first collecting selective values and ranges of values for topology parameters, said topology parameters including inner chip pads location and layout style, said layout style selectively being arc of circle, least encompassing rectangle, or constant bond length;
second generating a plurality of possible topology solutions, including recursively generating outer finger locations by iteratively relaxing and tightening tolerances on selected said topology parameters to define a plurality of topology solutions satisfying said values and ranges of values for said topology parameters;

third selecting from said plurality of possible topology solutions a selected solution;

fourth generating from said selected solution a topology solution; and fifth generating from said topology solution an output file.

16. The program storage device of claim 15, said topology including a plurality of bond lines selectively radiating from a line of chip pads to two finger or voltage lines within a quadrant of said chip carrier, said method steps further comprising:

sixth evaluating said topology solution for conformance to said topology parameters;

seventh selectively adjusting said topology solution and repeating said fourth step;

eighth placing a middle finger with respect to a middle chip pad; and ninth processing alternative chip pads to the right and left sequentially from said middle chip pad selectively to position ring intercepts, inner row fingers and outer row fingers with respect to corresponding chip pads.

17. An article of manufacture comprising:

a computer useable medium having computer readable program code means embodied therein for defining chip carrier topology, said topology including a plurality of bond lines radiating from a line of inner chip pads to two outer rows of finger bond lines including a first bond line outermost with respect to said line of chip pads and a second bond line innermost with respect to said line of chip pads, the computer readable program means in said article of manufacture comprising:

first computer readable program code means for causing a computer to effect collecting topology parameters, said topology parameters including inner chip pad locations and finger style, said finger style selectively including arc of circle, least encompassing rectangle, and constant wire bond length finger patterns;

second computer readable program code means for causing a computer to effect generating a plurality of possible topology solutions for placing outer fingers selectively to said first and second bond lines, said generating including placing a phantom finger on said first bond line with respect to a last postioned finger on said first bond line at a pitch iteratively relaxed and tightened during generating said plurality of possible topology solutions and placing an outer finger on said second bond line at a position angularly intermediate said phantom finger and said last positioned finger;

third computer readable program code means for causing a computer to effect selecting from said plurality of possible topology solutions a single possible solution;

fourth computer readable program code means for causing a computer to effect generating from said single possible solution a topology solution;

fifth computer readable program code means for causing a computer to effect generating from said topology solution an output file;

sixth computer readable program code means for causing a computer to effect evaluating said topology solution for conformance to said topology parameters and, responsive to failure to meet said parameters;

seventh computer readable program code means for causing a computer to effect adjusting said topology parameters and repeating said fourth step of generating said topology solution;

said fourth computer readable program code means for causing a computer to effect generating step further comprising:

eighth computer readable program code means for causing a computer to effect placing a middle finger with respect to a middle chip pad; and ninth computer readable program code means for causing a computer to effect processing alternative chip pads to the right and left sequentially from said middle chip pad selectively to position ring intercepts, inner row fingers and outer row fingers;

thereby enabling said single possible solution selectively to position said fingers within a quadrant of said chip carrier in one or a plurality of finger and voltage lines.

18. The method of claim 1, said topology parameters further comprising:

the number of rows of fingers;

when at least two rows of fingers, the spacing between rows of fingers;

finger style;

dimensions of output fingers;

minimum finger pair spacing; and maximum finger angle with respect to its bond line.

19. Method for defining outer finger placement for a chip carrier topology, comprising the steps of:

first collecting topology parameters, said topology including a plurality of bond lines radiating from a line of inner chip pads to a first outer finger line and a second outer finger line, and further including finger style, said finger style selectively including arc of circle, least encompassing rectangle, and constant wire bond length finger patterns;

second generating a plurality of topology solutions satisfying said topology parameters including recursively generating said outer finger placement by iteratively relaxing and tightening tolerances on selected said topology parameters to define a plurality of topology solutions satisfying said values and ranges of values for said topology parameters; and further including placing said outer fingers selectively to said first and second outer bond lines, said generating including placing a phantom finger on said first outer bond line with respect to a last positioned finger on said first outer bond line at a pitch iteratively relaxed and tightened during generating said plurality of possible topology solutions, placing an outer finger on said second outer bond line at a position angularly intermediate said phantom finger and said last positioned finger;

third selecting from said plurality of topology solutions a selected topology solution; and fourth generating from said selected topology solution an output file representing said selected topology solution, said fourth step including placing a middle finger with respect to a middle chip pad and processing alternative chip pads to the right and left sequentially from said middle chip pad selectively to position ring intercepts, inner row fingers and outer row fingers;

thereby enabling a topology solution selectively including a plurality of rows of fingers within a quadrant of a chip carrier.

20. The method of claim 19, the positioning of ring intercepts further comprising the steps of:
- selectively for fan out, setting finger pitch at the inner most ring;
- selectively for fan in, setting finger pitch at the ring of termination.

21. The method of claim 19, the positioning of inner row fingers further comprising the steps of:
- calculating a first inner row finger position with reference to the previously positioned outer row finger;
- calculating a second inner row finger position with reference to the previously positioned ring intercept; and
- selecting which of said first inner row finger position and said second inner row finger position satisfies all constraints.

22. The method of claim 21, said step for calculating a first inner row finger position comprising the further steps of:
- calculating a next phantom outer row finger location, said phantom finger representing a next finger location which may or may not exist;
- determining a midpoint between said phantom outer row finger location and the last outer row finger location;
- determining the position of said first inner row finger along the line segment connecting said midpoint and the chip pad for said first inner row finger; and
- responsive to determining that said phantom finger exists, selectively adjusting the position of said first inner row finger.

23. The method of claim 21 said step for calculating a second inner row finger position comprising the further steps of:
- locating the last ring bondline intercept;
- applying a minimum ring intercept spacing parameter to locate on said ring the next minimum acceptable ring intercept; and
- determining the position of said second inner row finger position by extrapolating out to the inner row the line segment connecting next minimum acceptable ring intercept and the chip pad for this inner row finger.

24. The method of claim 19, the positioning of outer row fingers further comprising the steps of:
- calculating this outer row finger first location with reference to finger pitch and topology style parameters;
- calculating this outer row finger second location with reference to the previous ring intercept; and
- selecting which of said first location and second location satisfies all constraints.

25. The method of claim 19, said chip topology including a plurality of sides, further comprising the steps of repeating said eighth and ninth steps for each of said plurality of sides.

26. The method of 24, said topology style parameter defining one of arc-of-circle, constant-bond-length, and encompassing-rectangle for placing outer row fingers.

27. System for defining chip carrier topology, said topology including a plurality of bond lines radiating from a line of chip pads to at least one finger or voltage line, comprising:
- a first module including a graphical user interface for collecting topology parameters, said topology parameters including finger style selectively determined as arc of circle, least encompassing rectangle, and constant wire bond length finger pattern;
- a second module for generating a plurality of possible topology solutions a plurality of possible topology solutions for placing outer fingers selectively to first and second outer bond lines, said generating including placing a phantom finger on said first outer bond line with respect to a last positioned finger on said first outer bond line at a pitch iteratively relaxed and tightened during generating said plurality of possible topology solutions, placing an outer finger on said second outer bond line at a position angular intermediate said phantom finger and said last positioned finger;
- a third module for selecting from said plurality of possible topology solutions a selected solution;
- a fourth module for generating from said selected solution an output file, including placing a middle finger with respect to a middle chip pad, processing alternative chip pads to the right and left sequentially from said middle chip pad selectively to position ring intercepts, inner row fingers and outer row fingers with respect to phantom fingers, each said phantom finger representing a next finger location which may or may not exist;
- thereby enabling a topology solution selectively including a plurality of rows of fingers within a quadrant of a chip carrier.

28. A program storage device readable by a machine, tangibly embodying a program of instructions executable by a machine to perform method steps for defining chip carrier topology, said topology including a plurality of discrete wire bond lines radiating from a line of inner chip pads to a plurality of finger bond lines including a first, outermost, outer bond line and a second, innermost, outer bond line, said method steps comprising:
- first collecting topology parameters including finger to finger spacing, voltage bond to voltage bond spacing, and voltage bond to adjacent finger wire spacing, and selectively including layout style as arc of circle, least encompassing rectangle, and constant bond length;
- second generating a plurality of possible topology solutions including recursively generating outer finger locations by iteratively relaxing and tightening tolerances on selected said topology parameters to define a plurality of topology solutions satisfying said values and ranges of values for said topology parameters and further including placing said outer fingers selectively to said first and second outer bond lines, said generating including placing a phantom finger on said first outer bond line with respect to a last positioned finger on said first outer bond line at a pitch iteratively relaxed and tightened during generating said plurality of possible topology solutions, placing an outer finger on said second outer bond line at a position angularly intermediate said phantom finger and said last positioned finger;
- third selecting and outputting from said plurality of possible topology solutions a selected solution.

* * * * *